(12) United States Patent
Phair et al.

(10) Patent No.: US 11,788,895 B2
(45) Date of Patent: Oct. 17, 2023

(54) MICROSYSTEM AND METHOD FOR MAKING A MICROSYSTEM

(71) Applicant: Avago Technologies International Sales Pte. Limited, Edinburgh (GB)

(72) Inventors: John Phair, Edinburgh (GB); Lutz Eckart, Edinburgh (GB)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 14 days.

(21) Appl. No.: 17/310,743

(22) PCT Filed: Feb. 17, 2020

(86) PCT No.: PCT/EP2020/054128
§ 371 (c)(1),
(2) Date: Aug. 20, 2021

(87) PCT Pub. No.: WO2020/169543
PCT Pub. Date: Aug. 27, 2020

(65) Prior Publication Data
US 2022/0018716 A1 Jan. 20, 2022

(30) Foreign Application Priority Data
Feb. 22, 2019 (GB) ...................................... 1902452

(51) Int. Cl.
*G01J 5/34* (2022.01)
*G01J 5/02* (2022.01)
(Continued)

(52) U.S. Cl.
CPC ................. *G01J 5/34* (2013.01); *G01J 5/024* (2013.01); *G01J 5/046* (2013.01); *G01J 5/048* (2013.01); *H10N 15/15* (2023.02)

(58) Field of Classification Search
CPC .... G01J 5/34; G01J 5/024; G01J 5/046; G01J 5/048; G01J 1/42; H01L 37/025; H01L 41/0533; H01L 41/1138
See application file for complete search history.

(56) References Cited

U.S. PATENT DOCUMENTS 4,367,408 A * 1/1983 Imai ..................... G01J 5/34
310/306
5,471,060 A 11/1995 Nomura et al.
(Continued)

FOREIGN PATENT DOCUMENTS

EP 0345048 A2 6/1989
EP 0640815 A1 3/1994
(Continued)

OTHER PUBLICATIONS

JP Application No. 2021-549478, Office Action, dated Aug. 30, 2022, 19 pages.
(Continued)

*Primary Examiner* — Marcus H Taningco
(74) *Attorney, Agent, or Firm* — Quarles & Brady LLP

(57) ABSTRACT

The invention relates to a microsystem (1) comprising a substrate (12), a bottom electrode (3) arranged on the substrate (12), a ferroelectric layer (4) arranged on the bottom electrode (3), a top electrode (5) arranged on the ferroelectric layer (4) and an isolation layer (6) that is electrically isolating, that is arranged on the top electrode (5), that extends from the top electrode (5) to the substrate (12) so that the isolation layer (6) covers the bottom electrode (3), the ferroelectric layer (4) and the substrate (12) in a region around the complete circumference of the bottom electrode (3), and the isolation layer (6) has the shape of a ring that confines in its centre a through hole (11) that is arranged in the region of the top electrode (5).

19 Claims, 5 Drawing Sheets

(51) Int. Cl.
    *G01J 5/04*    (2006.01)
    *H10N 15/10*   (2023.01)

(56) References Cited

U.S. PATENT DOCUMENTS

| | | | |
|---|---|---|---|
| 5,583,058 A * | 12/1996 | Utsumi | H01L 37/02 257/E27.008 |
| 6,320,192 B1 * | 11/2001 | Tominaga | G01N 21/61 250/343 |
| 2006/0073613 A1 | 4/2006 | Aggarwal et al. | |
| 2011/0182320 A1 | 7/2011 | Noda | |
| 2011/0316113 A1 | 12/2011 | Noda | |
| 2016/0035959 A1 | 2/2016 | Mayer et al. | |

FOREIGN PATENT DOCUMENTS

| | | |
|---|---|---|
| JP | H2-69623 | 3/1990 |
| JP | H7-55577 | 3/1995 |
| JP | H08-271341 | 10/1996 |
| JP | H9-288010 | 11/1997 |
| JP | 2008-232896 | 10/2008 |
| JP | 2011-153853 | 8/2011 |
| JP | 2012-8068 | 1/2012 |
| JP | 2012026860 A | 2/2012 |
| JP | 2016-119328 | 6/2016 |
| WO | 1993009414 | 5/1993 |
| WO | WO-2018-193824 | 10/2018 |
| WO | WO-2018-193825 | 10/2018 |

OTHER PUBLICATIONS

Chan et al., "Effects of Membrane Thickness on the Pyroelectric Properties of LiTaO3 Thin Film IR Detectors", Japanese Journal of Applied Physics, 2005, 5 pages, vol. 44, No. 2, 04R07036-41.

Gokhale et al., "Infrared Absorption Properties of Carbon Nanotube/Nanodiamond Based Thin Film Coatings", Journal of Microelectromechanical Systems, 2013, pp. 191-197, vol. 23, No. 1.

Lang et al., "Absorbing Layers for Thermal Infrared Detectors", Sensors and Actuators A: Physical, 1992, pp. 243-248, vol. 34, Issue 3.

Liu et al., "Study on the Performance of PECVD Silicon Nitride Thin Films", Defence Technology, 2013, pp. 121-126, vol. 9.

Liu et al., "Dynamic Manipulation of Infrared Radiation with MEMS Metamaterials", Advanced Optical Materials, 2013, pp. 559-562, vol. 1.

Norkus et al., "A 256-Pixel Pyroelectric Linear Array with New Black Coating", Proceedings of SPIE, Infrared Technology and Applications XXXVII, May 2011, 9 pages, vol. 8012, 80123V, doi: 10.1117/12.883107.

Tao et al., "A Metamaterial Absorber for the Terahertz Regime: Design, Fabrication and Characterization", Optics Express, 2008, pp. 7181-7188, vol. 16, No. 10.

International Search Report and Written Opinion for PCT/EP2020/054128 dated Jul. 30, 2020.

JP Application No. 2021-549478, Second Office Action, dated Feb. 21, 2023, 10 pages.

JP Application No. 2021-549478, Third Office Action, dated Jul. 4, 2023, 6 pages.

* cited by examiner

MICROSYSTEM AND METHOD FOR MAKING A MICROSYSTEM

This application is a U.S. National Phase application of PCT/EP2020/054128, filed on Feb. 17, 2020, which claims the benefit of GB Application No. 1902452.0, filed Feb. 22, 2019, both of which are incorporated herein by reference in their entirety.

The invention relates to a microsystem and a method for making a microsystem.

A microsystem can comprise a ferroelectric layer. Piezoelectric properties or pyroelectric properties of the ferroelectric layer can be used in the microsystem. In case the piezoelectric properties of the microsystem are used, it is conceivable to measure a pressure or to provide a pressure or a force with the microsystem. In case the pyroelectric properties of the microsystem are used, it is conceivable to detect temporal gradients of the intensity of infrared radiation. It is possible to arrange a multitude of sensor elements each having one of the ferroelectric layers on a common substrate. Together with a wavelength dispersive element, for example, a grating, a prism, and/or a linear variable filter, it is therefore possible to measure a spectrum with the microsystem. In order to minimize cross talk between the sensor elements, the substrate should be formed thin. This leads disadvantageously to a low mechanical strength of the microsystem, which can shorten the lifetime of the microsystem.

Ferroelectric materials, for example lead zirconate titanate (PZT), are often not very resistant against corrosion, in particular in the presence of hydrogen, oxygen and water. The corrosion can take place during use, storage and manufacture of the microsystem. The microsystem is conventionally made by a thermal deposition process, for example chemical vapour deposition (CVD) or physical vapour deposition (PVD). In the thermal deposition process, corrosion is especially problematic due to the high temperatures of the microsystem and chemically reactive atmosphere. Especially hydrogen can be problematic since it has the capability to penetrate electrodes like platinum electrodes and reduce the ferroelectric material especially under the conditions of the thermal deposition process. In the case that the electrodes are attached to the ferroelectric layer, the hydrogen might therefore penetrate the electrodes and corrode and/or reduce the ferroelectric layer. The limited resistance of the ferroelectric layer against corrosion, reduction and/or reaction might shorten the lifetime of the microsystem.

It is therefore an object of the invention to provide a microsystem and a method for making the microsystem, wherein the microsystem has a long lifetime.

The first inventive microsystem comprises a substrate, a bottom electrode arranged on the substrate, a ferroelectric layer arranged on the bottom electrode, a top electrode arranged on the ferroelectric layer and an isolation layer that is electrically isolating, that is arranged on the top electrode, that extends from the top electrode to the substrate so that the isolation layer covers the bottom electrode, the ferroelectric layer and the substrate in a region around the complete circumference of the top electrode, and the isolation layer has the shape of a ring that confines in its centre a through hole that is arranged in the region of the top electrode. An embodiment for the first inventive microsystem is shown in FIG. 1.

The second inventive microsystem comprises a substrate, a bottom electrode arranged on the substrate, a ferroelectric layer arranged on the bottom electrode, a top electrode arranged on the ferroelectric layer and an isolation layer that is electrically isolating, that is arranged on the top electrode, that extends from the top electrode to the substrate so that the isolation layer covers the bottom electrode, the ferroelectric layer and the substrate in a region around essentially the complete circumference of the top electrode, and the isolation layer has the shape of a ring that confines in its centre a through hole that is arranged in the region of the top electrode. An embodiment for the second inventive microsystem is shown in FIG. 5. The ring can for example have the shape of an ellipse, a circle, a square or a rectangle.

For the second inventive microsystem, it is preferred that the isolation layer comprises one or more recesses that extend (in what could be considered a radial direction) from outside of the ring to the through hole (as in FIG. 5). It is here particularly preferred that the isolation layer covers the bottom electrode, the ferroelectric layer and the substrate in a region of around at least 70° %, in particular at least 90%, of the complete circumference of the top electrode.

It is noted for completeness that for the second inventive microsystem, it would also be possible for the isolation layer to comprise one or more circumferentially extending recess that divides the ring into two or more (sub-)rings, for example (not illustrated). It would also be possible for one or more recesses in the isolation layer to form one or more pockets, e.g. to allow via connections through the isolation layer. In other words, in the second inventive microsystem, the isolation layer need not entirely cover the bottom electrode, the ferroelectric layer and the substrate in a region around the complete circumference of the top electrode. Optionally, the term "essentially" may be replaced with "mostly" or "at least partially" or "partially" throughout this disclosure.

For the first or second inventive microsystem, the isolation layer may help to extend the lifetime of the microsystem, e.g. by reducing corrosion of components on the substrate and/or compensate stress in the substrate.

For the first or second inventive microsystem, any one or more of the following areas may be defined:
- a perimeter area of the ferroelectric layer may be defined as an area of the ferroelectric layer that is not covered by the top electrode (when viewed from above, e.g. in a direction perpendicular to a plane parallel to the top electrode)
- a perimeter area of the bottom electrode layer may be defined as an area of the bottom electrode that is not covered by the ferroelectric layer (when viewed from above, e.g. in a direction perpendicular to a plane parallel to the top electrode)
- a perimeter area of the substrate may be defined as an area of the substrate that is not covered by the bottom electrode (when viewed from above, e.g. in a direction perpendicular to a plane parallel to the top electrode)

For the first or second inventive microsystem, 70% or more, more preferably 90% or more, of the perimeter area of any one of (preferably each of) the ferroelectric layer, the bottom electrode and the substrate, may be covered by the isolation layer.

For the first inventive microsystem, the perimeter area of any one of (preferably each) of the ferroelectric layer, the bottom electrode and the substrate, may be entirely covered by the isolation layer.

For the second inventive microsystem, the perimeter area of any one of (preferably each) of the ferroelectric layer, the bottom electrode and the substrate, may be entirely covered by the isolation layer except for one or more recesses.

Since the isolation layer covers the substrate in the region around the complete circumference or around essentially the complete circumference of the bottom electrode, the isolation layer increases the mechanical strength of the microsystem and thereby increases the lifetime of the microsystem. The isolation layer and the top electrode completely or essentially completely cover the ferroelectric layer on top and the isolation layer completely or essentially completely covers the ferroelectric layer on the sides so that the ferroelectric layer is completely or essentially completely covered. Therefore, the ferroelectric layer is protected against corrosion, which further increases the lifetime of the microsystem.

The ring can be furthermore used to support a wavelength filter of the microsystem. The wavelength filter can completely extend over the through hole so that the isolation layer supports the wavelength filter along the complete circumference of the through hole. By supporting the wavelength filter on the isolation layer, the microsystem having the wavelength filter can be made advantageously small. The wavelength filter can be adapted such that wavelengths outside the infrared wavelength region are blocked.

It is preferred that a substrate stress in the substrate in a region that has the ferroelectric layer on it has an opposite sign than an isolation layer stress in the isolation layer. This means either that the isolation layer stress is tensile and the substrate stress is compressive or that the isolation layer stress is compressive and the substrate stress is tensile. Since the isolation layer has the shape of the ring and is thereby relatively large, it is thereby possible to compensate the substrate stress by a large amount. This results in a high mechanical strength of the microsystem and thereby in a longer lifetime of the microsystem. Since the substrate stress is compensated, it is possible to make the substrate thin. The thin substrate advantageously reduces the thermal mass, increases the pyroelectric sensitivity, shortens the response time and reduces cross talk in the case that a multitude of sensor elements each having one of the bottom electrodes, one of the ferroelectric layers and one of the top electrodes are provided on the substrate. The substrate stress and the isolation layer stress depend on a large number of parameters during the manufacturing of the microsystem, e.g. a substrate temperature, thermal expansion coefficients of involved layers, deposition rates and etching rates. Reference [1] shows the influence of some manufacturing parameters on stress. A method for determining the stresses is also given in [1].

It is preferred that the thermal expansion coefficient of the isolation layer is lower than the thermal expansion coefficient of the ferroelectric layer and the thermal expansion coefficient of the substrate is higher than the thermal expansion coefficient of the ferroelectric layer or wherein the thermal expansion coefficient of the isolation layer is higher than the thermal expansion coefficient of the ferroelectric layer and the thermal expansion coefficient of the substrate is lower than the thermal expansion coefficient of the ferroelectric layer. The ferroelectric layer and the isolation layer are conventionally made by a thermal deposition process, in particular be chemical vapour deposition (CVD) or physical vapour deposition (PVD). During the thermal deposition process, the substrate is heated to high temperatures and subsequently cooled down to room temperatures. Since the substrate and the ferroelectric usually have different thermal expansion coefficients, this results in stresses both in the substrate and in the ferroelectric layer after cooling down the microsystem after the thermal deposition process. Since the isolation layer has the shape of a ring and is thereby relatively large, stresses in the ferroelectric layer can be obtained low by matching the thermal expansion coefficients of the substrate, the ferroelectric layer and the isolation layer as described before. The low stress in the ferroelectric layer result in a high mechanical strength of the ferroelectric layer and thereby in a long lifetime of the microsystem. In addition, the stresses in the substrate are low. It is thereby possible to make the substrate thin, which reduces thermal mass, increases the sensitivity, shortens the response time and subsequently reduces the cross talk in the case that the multitude of the sensor elements are provided. An example for obtaining the above mentioned thermal expansion coefficients is to make the isolation layer out of $Al_2O_3$ or SiC, to make the ferroelectric layer out of PZT or barium strontium titanate, and to make the substrate out of $SiO_2$ or Si.

It is preferred that the microsystem comprises a first conductor path that is at least partially arranged on and/or embedded within the isolation layer, and is coupled electrically conductive with the top electrode. For example, the conductor path could be partially or entirely arranged on the isolation layer, could be partially or entirely embedded in the isolation layer, or could be partially arranged on the isolation layer and partially embedded within the isolation layer. The first conductor path may be configured to provide an electrical connection to the top electrode, e.g. to associated circuitry. Since the isolation layer is electrically isolating and separates the first conductor path from the ferroelectric layer and the bottom electrode, electrical shorts can advantageously be avoided.

It is preferred that the isolation layer comprises an inorganic oxide, in particular $SiO_2$ or $Al_2O_3$, an inorganic nitride, in particular $Si_xN_y$, $Si_xO_yN_z$, $Si_xAl_wO_yN_z$, or an inorganic carbide, in particular SiC, GeC, or a moisture impermeable organic layer (e.g. polyimide, parylene or a multilayer stack thereof).

The ferroelectric layer comprises preferably at least one from a group comprising lead zirconate titanate, barium strontium titanate, potassium sodium niobate, manganese niobium barium titanate, manganese niobium barium titanate potassium barium titanate, and barium strontium niobate.

It is preferred that the top electrode comprises:
electrically conducting noble metals, in particular Au, Pt, Ag, Rh, Zr; and/or
electrically conductible nitrides, in particular at least one from a group comprising TiN, TaN, WN, TiAlN, SiTiAlN, SiAlN; and/or
electrically conductible oxides, in particular at least one from a group comprising $RuO_x$ and $IrO_x$. These substances are advantageously resistant against corrosion. For example, hydrogen cannot penetrate these substances. Therefore, the microsystem has a high resistance against corrosion and thereby a long lifetime. It is also conceivable that the top electrode essentially consists of the electrically conductible nitrides, in particular at least one from the group comprising TiN, TaN, WN and TiAlN, and/or wherein the top electrode essentially consists of the electrically conductible oxides, in particular at least from the group comprising $RuO_x$, $InO_x$ and $IrO_x$.

The microsystem preferably comprises an absorption layer. The absorption layer is preferably adapted to absorb infrared radiation.

The absorption layer may be arranged on the top electrode, and/or directly on the ferroelectric layer. The absorption layer may be arranged (e.g. positioned) in the through hole of the isolation layer.

Note that when the absorption layer is described as being "arranged" on another element, it is intended to mean that the absorption layer covers at least part of that other element, e.g. when the microsystem is viewed from above (see e.g. FIG. 1 and FIG. 6a). Describing the absorption layer as being "arranged" on another element does not require direct contact between the absorption layer and the other element except where it is stated that the absorption layer is arranged "directly" or "immediately" on the other element.

In some embodiments, the absorption layer may be arranged only in the through hole of the isolation layer, e.g. with the absorption layer being arranged on the top electrode and/or on the ferroelectric layer. Such an arrangement is shown in FIG. 2.

In some embodiments, the absorption layer may be arranged on each of the top electrode, the bottom electrode, the ferroelectric layer, and the isolation layer. The absorption layer may be arranged on part of the first conductor path (if present) and/or the second conductor path (if present).

In some embodiments, the absorption layer may be arranged on and cover substantially the entirety of the top electrode, the bottom electrode, the ferroelectric layer, the isolation layer. One or more gaps may be present in the absorption layer, e.g. to allow the electrical contact to be made to the first and/or second conductor paths.

In some embodiments, the absorption layer may be arranged both in the through hole of the isolation layer, and outside the through hole of the isolation layer, preferably with the absorption layer being arranged on each of the top electrode, the bottom electrode, the ferroelectric layer, the first conductor path, and the isolation layer.

The absorption layer may be formed separately from the top electrode, or formed in combination with the top electrode. The absorption layer may be physically structured or patterned, in consideration and optimization of all other layers in the ferroelectric stack, to enhance peak or broadband absorption of infrared light by the over infrared spectrum. By means of the absorption layer, more of the infrared radiation can be coupled into the ferroelectric layer in comparison to a microsystem not having the absorption layer. The absorption layer thereby results in a high signal-to-noise ratio of the microsystem. The deposition of the absorption layer is conventionally carried out at high temperatures (>150° C.) and in a corrosive atmosphere that in particular contains water and/or hydrogen. Since the ferroelectric layer is completely covered by the isolation layer and the top electrode, the ferroelectric layer is advantageously protected during the deposition of the absorption layer. The protection of the ferroelectric layer is especially high, if the top electrode comprises or essentially consists of the electrically conductible nitrides and/or the electrically conductible oxides.

It is preferred that the absorption layer comprises at least one of a group comprising platinum black, gold black, silver black, carbon nanotubes, one or more 2D conducting layers, a metallic film, a porous film (e.g. NiCr deposited by PVD glancing layer angle deposition), a noble metal (which may be arranged on or directly on the top electrode), an organic layer (preferably an organic layer which is water resistant e.g. polyimide, parylene, etc), a multilayer stack including a noble metal and a dielectric material (e.g. Pt/TiO2, Au/Al$_2$O$_3$, Pt/PZT, Ag/SiO2, Pt/SiC, etc.), a multilayer stack of a noble metal and an organic layer (preferably an organic layer which is water resistant e.g. polyimide, parylene, etc).

By way of example, the absorption layer may be or include graphene, a metallic film, a porous film (e.g. NiCr deposited by PVD glancing layer angle deposition). References [2], [3], [4] and [5] disclose how these absorption layers can be deposited.

By way of example, the absorption layer may include a multilayer stack including a noble metal and a dielectric material, e.g. Pt/TiO2, Au/Al$_2$O$_3$, Pt/PZT, Ag/SiO2, Pt/SiC, etc.

It is preferred that the absorption layer comprises a metamaterial that is adapted to enhance light absorption. An example for the metamaterial and a method for its production are disclosed in references [6] and [7].

The substrate can comprise or essentially consist of Si, SiO$_2$, GaAs, SiN, glass, and/or Al$_2$O$_3$.

It is preferred that the substrate comprises a membrane on which the bottom electrode is arranged, in particular wherein the membrane has a thickness of 10 nm to 10 μm. It is furthermore preferred that the membrane consists of maximal three layers or only two layers or only one layer. In case three layers are provided, these might be a Si layer and two SiO$_2$ layers that all of which might be doped with additional elements, in particular Al, N, wherein the bottom electrode is immediately arranged on the SiO$_2$ or other SiO$_2$ doped layer. In case two layers are provided, these might be a Si layer and a SiO$_2$ layer that might be doped with additional elements, in particular Al, N, wherein the bottom electrode is immediately arranged on the SiO$_2$ layer. In the case only one layer is provided, this might be a SiO$_2$ layer or an Al$_2$O$_3$ layer. Furthermore, it is preferred that the bottom electrode has a thickness from 1 nm to 200 nm, wherein the ferroelectric layer has a thickness from 1 nm to 10 μm, wherein the top electrode has a thickness from 1 nm to 1000 nm, wherein the isolation layer has a thickness from 1 nm to 10 μm.

It is preferred that the isolation layer is transparent for infrared radiation and covers also the top electrode. For this purpose, the isolation layer can consist of or essentially consist of Ge, Si, GaN, ZnO, ZnS, ZnSe, GeC, SiC, GaNC, ZnOC, ZnSC and/or ZnSeC. It is hereby conceivable that the isolation layer covers at least 70%, in particular at least 90% of the top electrode. The through hole can have only such a size that is necessary for electrically coupling the first conductor path with the top electrode. It is particularly preferred that the absorption layer is arranged on the isolation layer that is transparent for the infrared radiation.

A first method according to the invention for making a microsystem comprises the steps: providing a substrate; depositing a bottom electrode on the substrate; depositing a ferroelectric layer on the bottom electrode; depositing a top electrode on the ferroelectric layer; depositing an isolation layer on the ferroelectric layer, wherein the isolation layer extends from the top electrode to the substrate; depositing a photoresist on the isolation layer; structuring the photoresist so that the photoresist has a photoresist through hole in the region of the top electrode; etching the microsystem, so that the isolation layer has the shape of a ring that confines in its centre a through hole that corresponds to the photoresist through hole. The first method corresponds to a standard deposition process.

A second method according to the invention for making a microsystem comprises the steps: providing a substrate; depositing a bottom electrode on the substrate; depositing a ferroelectric layer on the bottom electrode; depositing a top electrode on the ferroelectric layer; depositing a lift-off photoresist on the top electrode; structuring the lift-off photoresist so that the lift-off photoresist remains only in the region of the top electrode; depositing an isolation layer on the lift-off photoresist, wherein the isolation layer is electrically isolating and extends from the lift-off photoresist to the substrate; lifting off the lift-off photoresist, so that the isolation layer has the shape of a ring that confines in its centre a through hole that corresponds to the lift-off photoresist after the structuring. The second method corresponds to a lift-off process.

It is for the first method and the second method preferred that the ring extends around the complete circumference of the top electrode. Alternatively, it is for the first method and the second method preferred that the isolation layer comprises one or more recesses that extend from outside of the ring to the through hole. The through hole and the one or more recesses can be manufactured by the same method steps. It is here particularly preferred that the isolation layer covers the bottom electrode, the ferroelectric layer and the substrate in a region of around at least 80%, in particular at least 90%, of the complete circumference of the top electrode.

It is for the first method and the second method preferred that the method comprises the step: depositing an absorption layer for absorbing infrared radiation on the top electrode. Since the ferroelectric layer is completely covered by the isolation layer and the top electrode, the ferroelectric layer is advantageously protected during the deposition of the absorption layer. The ferroelectric layer is particularly well protected if the top electrode comprises or essentially consists of the electrically conductible nitrides, in particular at least one from the group comprising TiN, TaN, WN, TiWN, TiAlN, SiTiAlN, SiAlN and/or the conductible oxides and/or noble metals, in particular at least one from the group comprising $RuO_x$, $IrO_x$.

It is for both methods preferred that the method is performed such that a substrate stress in the substrate in a region that has the ferroelectric layer on it has an opposite sign than an isolation layer stress in the isolation layer. A person skilled in the art would be able to make experiments in which he varies process parameters, for example a substrate temperature, thermal expansion coefficient of the substrate, the ferroelectric layer and the isolation layer, deposition rates and etching rates, in order to figure out, which process parameters leads to the substrate stress and the isolation layer stress have the opposite signs. In particular the thermal expansion coefficients have a strong influence on the substrate stress and the isolation layer stress. The stresses can be determined as described in [1]. The opposite signs of the substrate stress and the isolation stress lead to a high mechanical strength of the microsystem and thereby to a long lifetime of the microsystem.

It is for both methods preferred that the thermal expansion coefficient of the isolation layer is lower than the thermal expansion coefficient of the ferroelectric layer and the thermal expansion coefficient of the substrate is higher than the thermal expansion coefficient of the ferroelectric layer or wherein the thermal expansion coefficient of the isolation layer is higher than the thermal expansion coefficient of the ferroelectric layer and the thermal expansion coefficient of the substrate is lower than the thermal expansion coefficient of the ferroelectric layer and wherein the method comprises the steps: during deposition of the ferroelectric layer and the isolation layer, heating the substrate to a temperature of at least 350° C., and after depositing the isolation layer (6), cooling down the substrate (12) to a maximum temperature of 50° C.

In the following, the invention is explained on the basis of schematic drawings.

FIG. 6b shows a cross section of the third microsystem of FIG. 6a.

Figure 1:
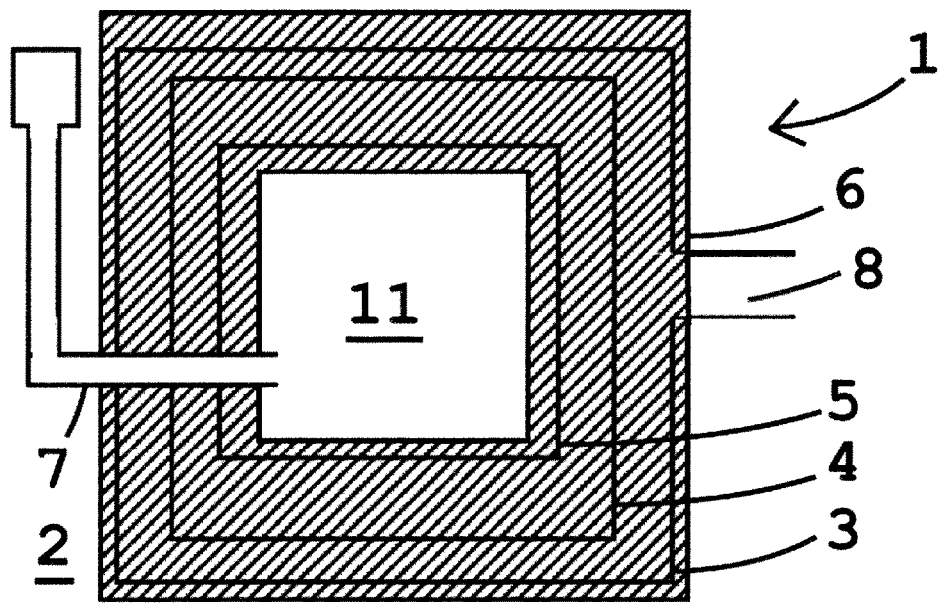
FIG. 1 shows a top view of a first microsystem according to the invention.
Figure 2:
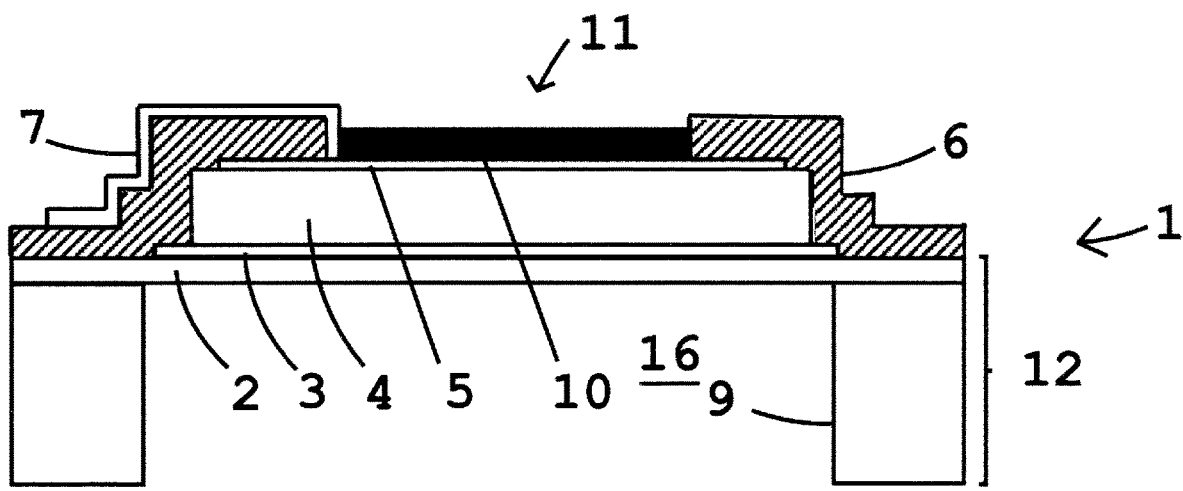
FIG. 2 shows a cross section of the microsystem of FIG. 1.
Figure 5:
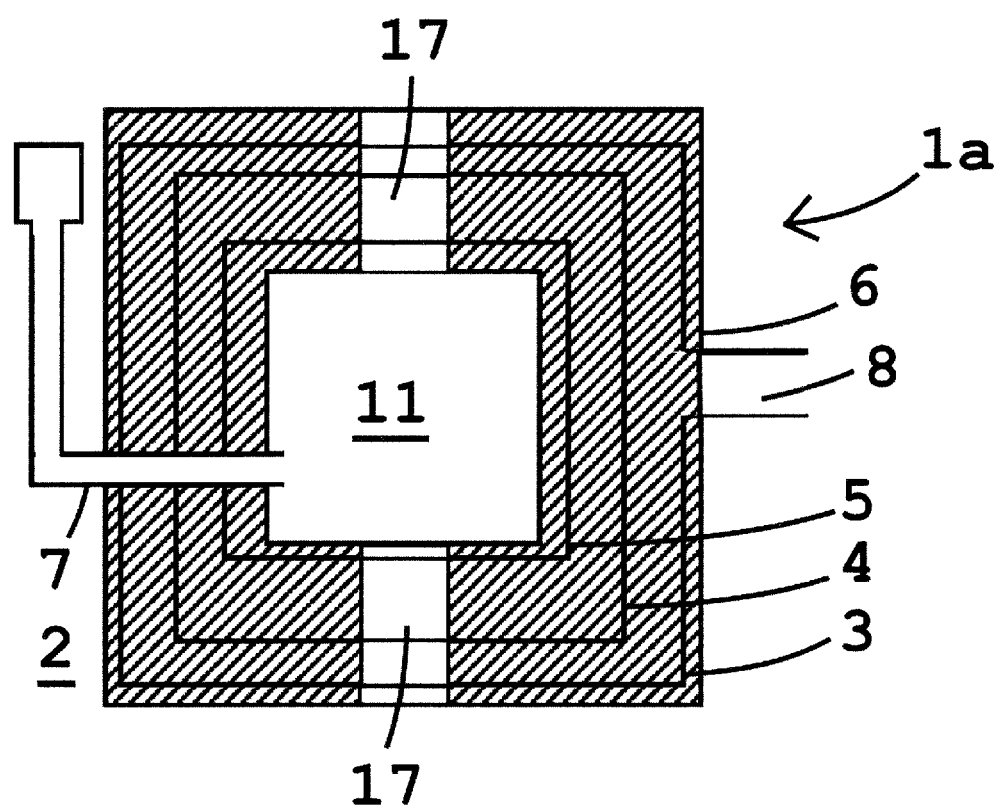
FIG. 5 shows a top view of a second microsystem according to the invention.

As it can be seen from FIGS. 1, 2 and 5, a first microsystem 1 comprises a substrate 12, a bottom electrode 3, a ferroelectric layer 4, a top electrode 5 and an isolation layer 6. The bottom electrode 3 is arranged immediately on a substrate surface of the substrate 12. The ferroelectric layer 4 is immediately arranged on the bottom electrode 3 and the top electrode 5 is immediately arranged on the ferroelectric layer 4. The bottom electrode 3 has in a plane parallel to the substrate surface a larger cross section than the ferroelectric layer 3 in a plane parallel to the substrate surface. The bottom electrode 3 protrudes from the ferroelectric layer 4 around the complete circumference of the ferroelectric layer 4. The ferroelectric layer 4 has in a plane parallel to the substrate surface a larger cross section than the top electrode 5 in a plane parallel to the substrate surface. The ferroelectric layer 4 protrudes from the top electrode 5 around the complete circumference of the top electrode 5.

The microsystem 1 comprises an isolation layer 6 that is electrically isolating. The isolation layer 6 is arranged immediately on the top electrode 5 and extends from the top electrode 5 to the substrate 12. According to FIG. 1, the isolation layer 6 covers the bottom electrode 3 in a region around the complete circumference of the ferroelectric layer 4 and the ferroelectric layer 4 in a region around the complete circumference of the top electrode 5. The isolation layer 6 also covers the substrate 12 in a region around the complete circumference of the top electrode 5. According to FIGS. 1 and 5, the isolation layer 6 has the shape of a ring that confines in its centre a through hole 11 that is completely arranged in the region of the top electrode 5. The through hole 11 has in a plane parallel to the substrate surface a smaller cross section than top electrode 5 in a plane parallel to the substrate surface.

According to a second microsystem 1a as shown in FIG. 5, the isolation layer 6 comprises one or more recesses 17 that in this example extend (in what could be considered a radial direction) from outside of the ring formed by the isolation layer 6 to the through hole 11. It is conceivable that the isolation layer 6 might cover the bottom electrode 3, the ferroelectric layer 4 and the substrate in a region around at least 70%, in particular at least 90%, of the complete circumference of the top electrode 5.

Additionally/alternatively, 70% or more, more preferably 90% or more, of the perimeter area of any one of (preferably each of) the ferroelectric layer, the bottom electrode and the substrate, may be covered by the isolation layer (these perimeter areas have already been defined above, noting that as shown in these drawings, viewed from above refers to looking down at the microsystem from the side of the ferroelectric layer 4 on which the top electrode 5 is located).

Although FIG. 5 shows recesses 17 that extend in what could be considered a radial direction, recesses that extend in a circumferential direction, or which simply form pockets within the isolation layer, are also possible, for example.

According to the microsystems 1, 1a of both FIGS. 1 and 5, the bottom electrode 3, the ferroelectric layer 4 and the top electrode 5 can have, as shown in FIG. 1, in a respective plane parallel to the substrate surface, the shape of a rectangle. The isolation layer 6 can have in a plane parallel to the substrate surface on the peripheral end the shape of a rectangle. The through hole 11 can have the shape of a rectangle.

The microsystem 1 (and also the microsystem 1*a*) comprises furthermore a first conductor path 7 that in this example is immediately arranged on the isolation layer 6 and is coupled electrically conductive with the top electrode 5. Although not shown here, it would also be possible for the first conductor path 7 to be partially or entirely embedded within the isolation layer 6.

The microsystem 1 (and also the microsystem 1*a*) also comprises a second conductor path 8 that is arranged between the substrate 12 and the isolation layer 6 and is coupled electrically conductive with the bottom electrode 3.

In the first microsystem 1 (and also the microsystem 1*a*) can comprise an absorption layer 10 (shown in FIG. 2) that is adapted to absorb infrared radiation. In this example, as shown by FIG. 1, the absorption layer 10 is arranged immediately on the top electrode 5 and in the through hole 11 of the isolation layer 6. The absorption layer 10 contacts the isolation layer 6 completely around a circumference in a plane parallel to the substrate surface with the exception of the first conductor path 7 that is arranged at one position of the circumference in the plane parallel to the substrate surface between the absorption layer 10 and the isolation layer 6 for coupling electrically conducting with the top electrode 5. It is also conceivable that the absorption layer 10 might extend over the isolation layer 6, as discussed in more detail below with reference to FIGS. 6*a-b*. It is conceivable that the absorption layer comprises at least one of a group comprising platinum black, gold black, silver black, carbon nanotubes, 2D conducting layers, a metallic film, and a porous film (wherein the porous film may be NiCr deposited by PVD glancing layer angle deposition), a noble metal (which may be arranged on or directly on the top electrode), an organic layer (preferably an organic layer which is water resistant e.g. polyimide, parylene, etc), a multilayer stack including a noble metal and a dielectric material (e.g. Pt/TiO2, Au/Al$_2$O$_3$, Pt/PZT, Ag/SiO2, Pt/SiC, etc.), a multilayer stack of a noble metal and an organic layer (preferably an organic layer which is water resistant e.g. polyimide, parylene, etc).

In addition, the microsystem 1 (and also the microsystem 1*a*) can comprise a wavelength filter (not shown) that is supported by the isolation layer 6 and that extends over the complete through hole 11. The wavelength filter can be adapted such that wavelengths outside the infrared wavelength region are blocked. In the case that also the absorption layer 10 is provided, the absorption layer 10 is arranged between the top electrode 5 and the wavelength filter.

As it can be seen in FIG. 2, the substrate 12 can comprise a membrane 2 and a multitude of membrane supports 9 that support the membrane 2. The membrane 2 and the membrane supports 9 can be made by etching cavities 16 between the membrane supports 9 out of a wafer.

It is possible that the microsystem 1 comprises a multitude of sensor elements each having one of the bottom electrodes 3, one of the ferroelectric layers 4, one of the top electrodes 5, one of the isolation layers 6, one of the first conductor paths 7, and one of the second conductor paths 8 on the substrate 12. Here, the isolation layers 6 can be arranged spatially separated from each other, in order to keep cross talk between neighboured sensor elements low. Each of the sensor elements can also comprise one of the absorption layers 10.

The isolation layer 6 can comprise an inorganic oxide, in particular SiO$_2$ or Al$_2$O$_3$, an inorganic nitride, in particular Si$_x$N$_y$, Si$_x$O$_y$N$_z$, Si$_x$Al$_w$O$_y$N$_z$, or an inorganic carbide, in particular SiC, GeC. The ferroelectric layer 4 can comprise at least one from a group comprising lead zirconate titanate, barium strontium titanate, potassium sodium niobate, manganese niobium barium titanate, manganese niobium barium titanate potassium barium titanate, and barium strontium niobate. The top electrode 5 can comprise electrically conductible nitrides, in particular at least one from a group comprising TiN, TaN, WN, TiAlN, and/or wherein the top electrode can comprise electrically conductible oxides, in particular at least one from a group comprising RuO$_x$, IrO$_x$. The substrate can comprise or essentially consist of Si, SiO$_2$, and/or Al$_2$O$_3$.

The membrane 2 can have a thickness of 10 nm to 10 µm. The bottom electrode 3 can have a thickness from 1 nm to 200 nm. The ferroelectric layer 4 can have a thickness from 1 nm to 10 µm. The top electrode can have a thickness from 1 nm to 1000 nm. The isolation layer 6 can have a thickness from 1 nm to 10 µm.

Figure 3:
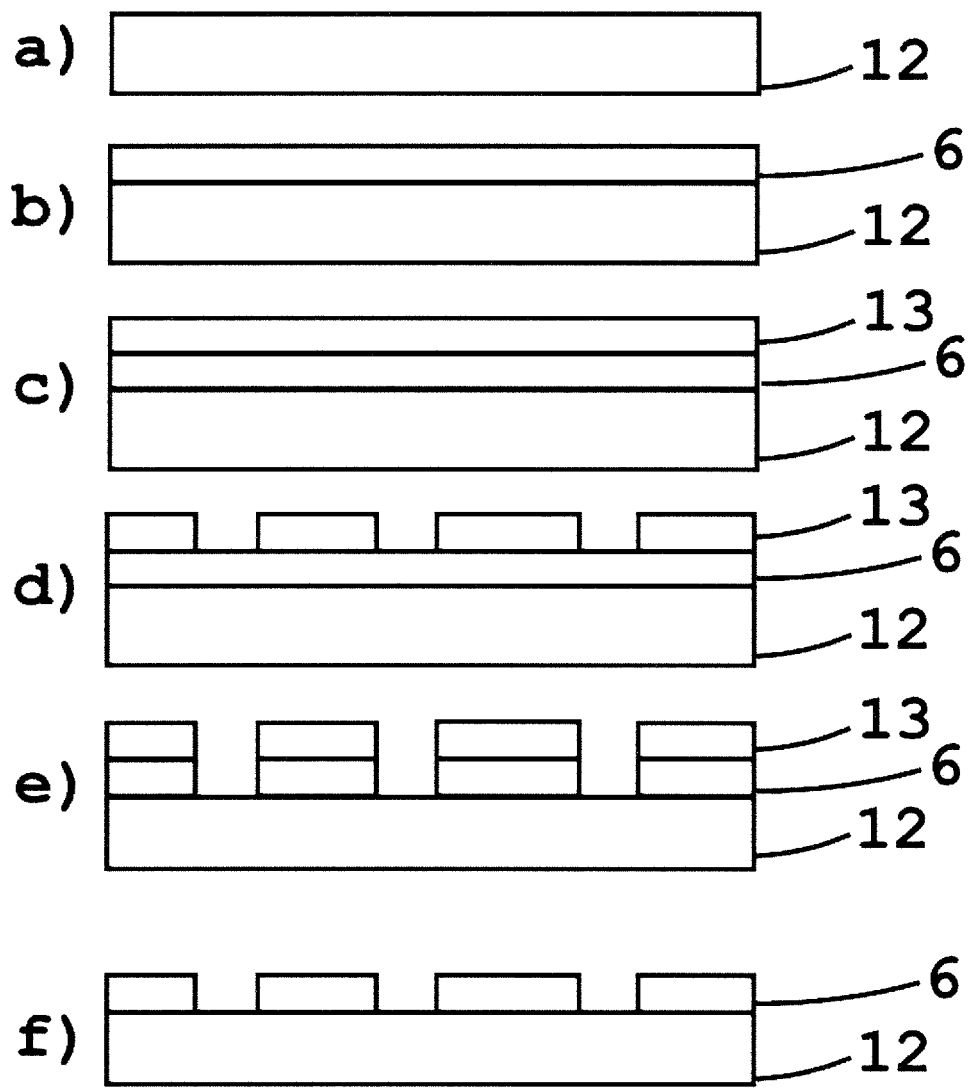
FIG. 3 shows a first method according to the invention for making the microsystem.

FIG. 3 illustrates a first method for making the microsystem. The first method corresponds to a standard deposition process. The first method comprises the steps:
providing a substrate 12 (step a) in FIG. 3);
depositing a bottom electrode 3 on the substrate 12;
depositing a ferroelectric layer 4 on the bottom electrode 3;
depositing a top electrode 5 on the ferroelectric layer 4;
depositing an isolation layer 6 on the ferroelectric layer 4, wherein the isolation layer 6 extends from the top electrode 5 to the substrate 12 (step b) in FIG. 3);
depositing a photoresist 13 on the isolation layer 6 (step c) in FIG. 3);
structuring the photoresist 13 so that the photoresist 13 has a photoresist through hole in the region of the top electrode 5 (step d) in FIG. 3);
etching the microsystem 1, so that the isolation layer 6 has the shape of a ring that confines in its centre a through hole 11 that corresponds to the photoresist through hole (step e) in FIG. 3).

As it can be seen from FIG. 3, the first method can furthermore comprise the step:
removing the photoresist 13 (step f) in FIG. 3).

Figure 4:
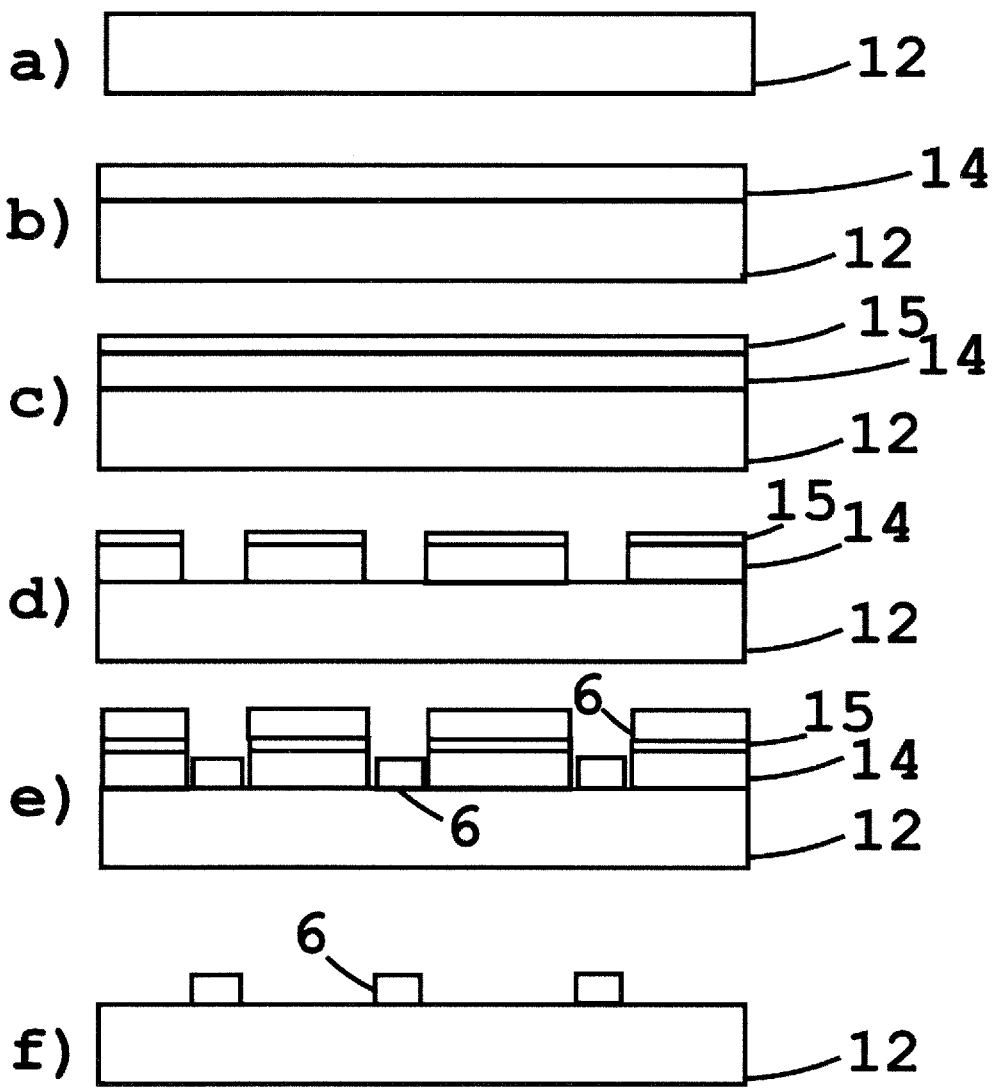
FIG. 4 shows a second method according to the invention for making the microsystem.

FIG. 4 illustrates a second method for making the microsystem. The second method corresponds to a lift-off deposition process.

The second method comprises the steps:
providing a substrate 12 (step a) in FIG. 4);
depositing a bottom electrode 3 on the substrate 12;
depositing a ferroelectric layer 4 on the bottom electrode 3;
depositing a top electrode 5 on the ferroelectric layer 4;
depositing a lift-off photoresist 14 on the top electrode 5 (step b) in FIG. 4);
structuring the lift-off photoresist 14 so that the lift-off photoresist 14 remains only in the region of the top electrode 5 (step d) in FIG. 4);
depositing an isolation layer 6 on the lift-off photoresist 14, wherein the isolation layer 6 is electrically isolating and extends from the lift-off photoresist 14 to the substrate 12 (step e) in FIG. 4);
lifting off the lift-off photoresist 14, so that the isolation layer 6 has the shape of a ring that confines in its centre a through hole 11 that corresponds to the lift-off photoresist 14 after the structuring (step f) in FIG. 4).

As it can be seen from FIG. 4, the second method can furthermore comprise the step:

depositing an additional resist 15 on the lift-off photoresist 14 (step c) in FIG. 4).

Both method can comprise the step: —depositing an absorption layer 10 for absorbing infrared radiation on the top electrode 5.

In both methods, the structuring of the photoresist 13, of the lift-off photoresist 14 and the 15 additional photoresist can comprise irradiation, in particular by means of UV light and/or light at a specific wavelength.

For both methods it is conceivable that the thermal expansion coefficient of the isolation layer 6 is lower than the thermal expansion coefficient of the ferroelectric layer 4 and the thermal expansion coefficient of the substrate 12 is higher than the thermal expansion coefficient of the ferroelectric layer 4 or wherein the thermal expansion coefficient of the isolation layer 6 is higher than the thermal expansion coefficient of the ferroelectric layer 4 and the thermal expansion coefficient of the substrate 12 is lower than the thermal expansion coefficient of the ferroelectric layer 4 and wherein during deposition of the ferroelectric layer 4 and the substrate isolation layer 6, the substrate 12 is heated to a temperature of at least 350° C., and wherein the method comprises the step: —after depositing the isolation layer 6, cooling down the substrate 12 to a maximum temperature of 50° C.

Figure 6A:
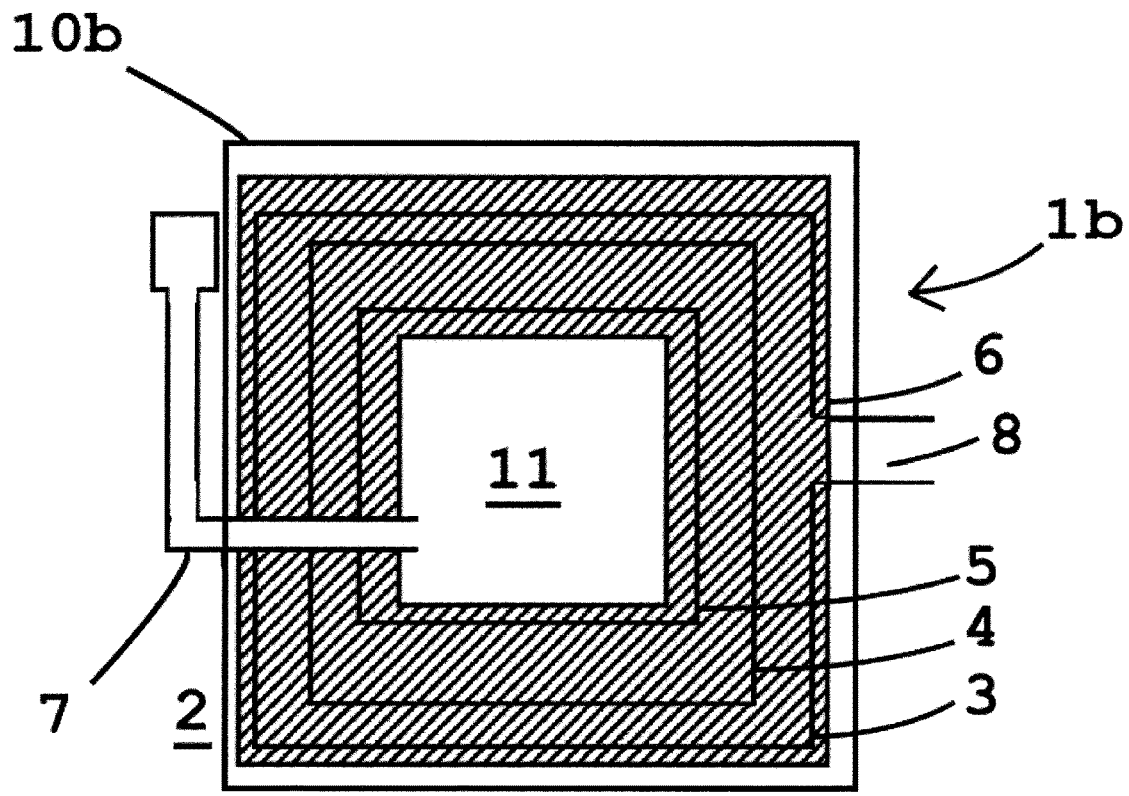
FIG. 6a shows a top view of a third microsystem according to the invention.
Figure 6B:
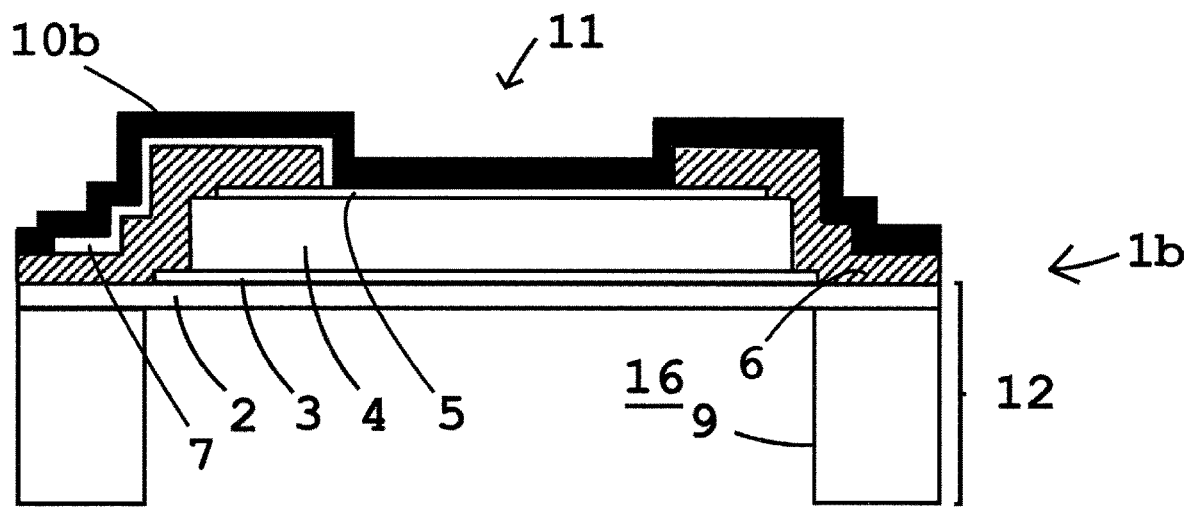

FIGS. 6a-b show a third microsystem 1b in which the absorption layer 10b is arranged both in the through hole 11 of the isolation layer 6, and outside the through hole 11 of the isolation layer 6, with the absorption layer 10b being arranged on and to cover substantially the entirety of each of the top electrode 5, the bottom electrode 3, the ferroelectric layer 4, and the isolation layer 6. One or more gaps may be present in the absorption layer 10b, e.g. to allow the electrical contact to be made to the first and/or second conductor paths 7, 8. The first and/or second conductor path 7, 8 may be partially covered by the absorption layer.

The absorption layer 10b may be formed as described previously in relation to the first and second microsystems 1, 1a.

Although not shown in FIGS. 6a-b, a skilled person would appreciate that one or more holes may be formed in the absorption layer 10b and/or one or more other layers (e.g. the isolation layer 6) to facilitate any necessary electrical connections or disconnections (e.g. to the bottom electrode 3).

In other respects, the third microsystem 1b of FIGS. 6a-b is similar to the first microsystem 1 of FIGS. 1-2.

Corresponding features have been given corresponding reference numbers and need not be described further herein.

REFERENCES

[1] Liang LIU, Wei-guo LIU, Na CAO, Chang-long CAI, "Study on The Performance of PECVD Silicon Nitride Thin Films", Defence Technology 9 (2013) 121-126.
[2] V. J Gokhale, O. Shenderova, G. E. McGuire, M Rais-Zadeh, "Infrared Absorption Properties of Carbon Nanotube/Nanodiamond Based Thin Film Coatings", Journal of Microelectromechanical Systems 23(1): 191-197.
[3] Volkmar Norkus, Marco Schossig, Gerald Gerlach, Reinhard Kahler, "A 256-pixel pyroelectric linear array with new black coating", Proc. SPIE 8012, Infrared Technology and Applications XXXVII, 80123V (21 May 2011); doi: 10.1117/12.883107.
[4] C-C. Chan, M-C. Kao and Y-C Chen, "Effects of Membrane Thickness on the Pyroelectric Properties of LiTaO3 Thin Film IR Detectors", Jpn. J. Appl. Phys., Vol. 44, No. 2 (2005) 04R07036-41.
[5] W. Lang, K. Ktihl, H. Sandmaier "Absorbing layers for thermal infrared detectors", Sensors and Actuators A: Physical, Volume 34, Issue 3, September 1992, Pages 243-248.
[6] Liu, X; Padilla, W J; Dynamic Manipulation of Infrared Radiation with MEMS Metamaterials, Advanced Optical Materials 1, 559 (2013).
[7] H. Tao, N. I. Landy, C. M. Bingham, X. Zhang, R. D. Averitt, W. J. Padilla A metamaterial absorber for the terahertz regime: Design, fabrication and characterization Opt. Express, 16 (2008), pp. 7181-7188.

LIST OF REFERENCE SIGNS 1, 1a, 1b microsystem
2 membrane
3 bottom electrode
4 ferroelectric layer
5 top electrode
6 isolation layer
7 first conductor path
8 second conductor path
9 membrane support
10, 10b absorption layer
11 through hole
12 substrate
13 photoresist
14 lift-off photoresist
15 additional photoresist
16 cavity
17 recess

The invention claimed is:

1. A microsystem comprising a substrate, a bottom electrode arranged on the substrate, a ferroelectric layer arranged on the bottom electrode, a top electrode arranged on the ferroelectric layer and an isolation layer that is electrically isolating, that is arranged on the top electrode, that extends from the top electrode to the substrate so that the isolation layer covers the bottom electrode, the ferroelectric layer and the substrate in a region around a circumference of the top electrode, and the isolation layer has the shape of a ring that confines in its centre a through hole that is arranged in the region of the top electrode;
wherein the microsystem further comprises an absorption layer arranged in the through hole of the isolation layer, the absorption layer is physically patterned and is configured to absorb infrared radiation.

2. The microsystem according to claim 1, wherein a substrate stress in the substrate in a region that has the ferroelectric layer on it has an opposite sign than an isolation layer stress in the isolation layer.

3. The microsystem according to claim 1, wherein the thermal expansion coefficient of the isolation layer is lower than the thermal expansion coefficient of the ferroelectric layer and the thermal expansion coefficient of the substrate is higher than the thermal expansion coefficient of the ferroelectric layer or wherein the thermal expansion coefficient of the isolation layer is higher than the thermal expansion coefficient of the ferroelectric layer and the thermal expansion coefficient of the substrate is lower than the thermal expansion coefficient of the ferroelectric layer.

4. The microsystem according to claim 1, wherein the microsystem comprises a first conductor path that is at least partially arranged on and/or embedded within the isolation layer and is coupled electrically conductive with the top electrode.

5. The microsystem according to claim 1, wherein the isolation layer comprises an inorganic oxide, an inorganic nitride, an inorganic carbide, or a moisture impermeable organic layer.

6. The microsystem according to claim 1, wherein the ferroelectric layer comprises at least one from a group comprising lead zirconate titanate, barium strontium titanate, potassium sodium niobate, manganese niobium barium titanate, manganese niobium barium titanate potassium barium titanate, and barium strontium niobate.

7. The microsystem according to claim 1, wherein the top electrode comprises: electrically conducting noble or unreactive metals including Au, Pt, Ag, Rh, Zr; and/or electrically conductible nitrides, including at least one from a group comprising TiN, TaN, WN, TiWN, TiAlN, SiTiAlN, SiAlN; and/or electrically conductible oxides, including at least one from a group comprising RuO.sub.x, IrO.sub.x.

8. The microsystem according to claim 1, wherein the absorption layer is adapted to absorb infrared radiation and is arranged on the top electrode and/or directly on the ferroelectric layer.

9. The microsystem according to claim 8, wherein the absorption layer is arranged on each of the top electrode, the bottom electrode, the ferroelectric layer, and the isolation layer.

10. The microsystem according to claim 9, wherein the absorption layer covers substantially the entirety of the top electrode, the bottom electrode, the ferroelectric layer, and the isolation layer.

11. The microsystem according to claim 8, wherein the absorption layer comprises at least one of a group comprising platinum black, gold black, silver black, carbon nanotubes, one or more 2D conducting layers, a metallic film, a porous film, a noble metal, an organic layer, a multilayer stack including a noble metal and a dielectric material, a multilayer stack of a noble metal and an organic layer.

12. The microsystem according to claim 1, wherein the substrate comprises a membrane on which the bottom electrode is arranged, and wherein the membrane has a thickness of 10 nm to 10 μm.

13. The microsystem according to claim 1, wherein the bottom electrode has a thickness from 1 nm to 200 nm, wherein the ferroelectric layer has a thickness from 1 nm to 10 μm, wherein the top electrode has a thickness from 1 nm to 1000 nm, wherein the isolation layer has a thickness from 1 nm to 10 μm.

14. The microsystem according to claim 1, wherein the isolation layer is transparent for infrared radiation and covers also the top electrode.

15. The microsystem according to claim 1, wherein the absorption layer comprises a gap configured to provide electrical contact to the top electrode.

16. A microsystem comprising a substrate, a bottom electrode arranged on the substrate, a ferroelectric layer arranged on the bottom electrode, a top electrode arranged on the ferroelectric layer and an isolation layer that is electrically isolating, that is arranged on the top electrode, that extends from the top electrode to the substrate so that the isolation layer covers the bottom electrode, the ferroelectric layer and the substrate in a region around a circumference of the top electrode, and the isolation layer has the shape of a ring that confines in its centre a through hole that is arranged in the region of the top electrode;
wherein the microsystem further comprises an absorption layer arranged in the through hole of the isolation layer, the absorption layer is configured to absorb infrared radiation.

17. A method for making a microsystem, with the steps:
providing a substrate; depositing a bottom electrode on the substrate; depositing a ferroelectric layer on the bottom electrode;
depositing a top electrode on the ferroelectric layer;
depositing an isolation layer on the ferroelectric layer, wherein the isolation layer extends from the top electrode to the substrate;
depositing a photoresist on the isolation layer;
structuring the photoresist so that the photoresist has a photoresist through hole in the region of the top electrode;
etching the microsystem, so that the isolation layer has the shape of a ring that confines in its centre a through hole that corresponds to the photoresist through hole; and
depositing an absorption layer for absorbing infrared radiation on the top electrode, the absorption layer being arranged in the through hole of the isolation layer;
wherein the absorption layer is physically patterned and is configured to absorb infrared radiation.

18. The method according to claim 17, wherein the thermal expansion coefficient of the isolation layer is lower than the thermal expansion coefficient of the ferroelectric layer and the thermal expansion coefficient of the substrate is higher than the thermal expansion coefficient of the ferroelectric layer or wherein the thermal expansion coefficient of the isolation layer is higher than the thermal expansion coefficient of the ferroelectric layer and the thermal expansion coefficient of the substrate is lower than the thermal expansion coefficient of the ferroelectric layer and wherein the method comprises the steps: during deposition of the ferroelectric layer and the isolation layer, heating the substrate to a temperature of at least 350° C., and after depositing the isolation layer, cooling down the substrate to a maximum temperature of 50° C.

19. A method for making a microsystem, with the steps:
providing a substrate; depositing a bottom electrode on the substrate;
depositing a ferroelectric layer on the bottom electrode;
depositing a top electrode on the ferroelectric layer;
depositing a lift-off photoresist on the top electrode;
structuring the lift-off photoresist so that the lift-off photoresist remains only in the region of the top electrode;
depositing an isolation layer on the lift-off photoresist, wherein the isolation layer is electrically isolating and extends from the lift-off photoresist to the substrate;
lifting off the lift-off photoresist, so that the isolation layer has the shape of a ring that confines in its centre a through hole that corresponds to the lift-off photoresist after the structuring; and
depositing an absorption layer for absorbing infrared radiation on the top electrode, the absorption layer being arranged in the through hole of the isolation layer;
wherein the absorption layer is physically patterned and is configured to absorb infrared radiation.

* * * * *